Sept. 8, 1959 J. E. McBRIAN 2,903,536

RELAY FOR PRINTED CIRCUITS

Filed Nov. 8, 1957

INVENTOR.
John E. McBrian

BY Kane, Dalsimer and Kane

ATTORNEYS

United States Patent Office 2,903,536
Patented Sept. 8, 1959

2,903,536

RELAY FOR PRINTED CIRCUITS

John E. McBrian, Old Saybrook, Conn.

Application November 8, 1957, Serial No. 695,340
10 Claims. (Cl. 200—87)

This invention relates generally to electromagnetic relays and switches, and more particularly to an electromagnetic relay for use in printed circuits.

Electromagnetic relays as components in electrical circuitry have been utilized in the past for various purposes. With the innovation of automation and printed circuit techniques wholly new component designs have been required to enable the components such as electromagnetic relays and switches to be used in printed circuit applications.

The electromagnetic relay as a printed circuit component has undergone radical changes in its overall design; but many problems resulting from the use of the electromagnetic relay or switch in conjunction with printed circuits had not been solved prior to the invention described herein. The relay described herein has been designed for specific use in printed circuit applications, and embodies new and functionally different features which solve many of the problems heretofore existing in the application of electromagnetic relays and switches to the printed circuit art.

The invention herein disclosed has as its principal object the furnishing of a new relay for printed circuits which is sensitive, yet small and compact so that it is compatible with the other printed circuit components.

Another object of this invention is to provide a relay which is of such mechanical design and configuration that it can be used with printed circuit techniques such as solder dipping of the board for example.

A further object of this invention is to provide an electromagnetic relay for printed circuits which is shock and vibration resistant so that it will operate satisfactorily under conditions of shock and vibration.

Still another object of this invention is the provision of an electromagnetic relay that is insulated both magnetically and electrically so that it will not interfere with other surrounding components and circuitry on a printed circuit board, and its operation will not be affected by other components in its vicinity.

Another object of this invention is to provide a relay for printed circuits which is easy to assemble and mount, and which can be used in alternating current or direct current applications.

Still another object of this invention is to provide a relay wherein the speed of contact can be easily predetermined, and undesirable bounce at the contacts is eliminated.

Another object of this invention is to provide an electromagnetic relay or switch for printed circuits having a high sensitivity and a minimum magnetic path reluctance.

A relay for printed circuits embodying the invention and the manner of using the same is described herein with references to the drawings in which.

The invention herein is described and illustrated in terms of a relay or switch for a printed circuit. It should be understood, however, that the new features of this invention which can be adapted to usage in other than printed circuit techniques, are claimed by me as well as will be further recognized upon reference to the claims following this description. Also, certain of these features, if applied to components other than of the relay or switch type, still will come within the spirit of this invention whose scope is defined by the claims attached hereto.

Figure 1:
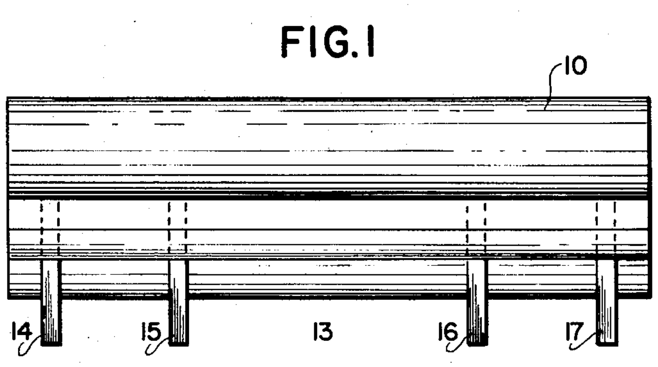
Fig. 1 is a side elevational view of a relay for printed circuits designed in accordance with the teachings of this invention.
Figure 2:
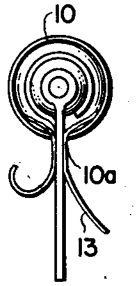
Fig. 2 is an end elevational view of the relay shown in Fig. 1.

The electromagnetic relay is shown fully assembled in Figs. 1 and 2. The relay consists of case 10 which is a cylindrical hollow tube formed from a resilient magnetic material and has a slot 10*a* formed therein which extends lengthwise and parallel to the case axis. Case 10 surrounds coil 11 which is wound around tube 12 and which is separated or insulated from case 10 by means of insulation paper 13 between the coil and the cylindrical tube. Leads 14, 15, 16 and 17 extend from case 10 through slot 10*a*.

Figure 3:
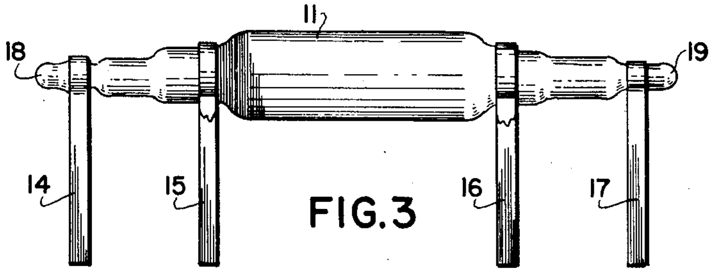
Fig. 3 is a side elevational view of the relay shown in Fig. 1 with the outer casing removed.
Figure 4:
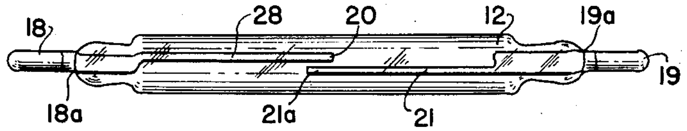
Fig. 4 is a side elevational view of the relay shown in Fig. 1 with the outer casing and the coil removed so that the contacts of the switch are visible through its envelope.

The glass tube which is shown in detail in Fig. 3 is a hermetically sealed glass envelope having solid rods 18 and 19 extending from its ends and metal to glass seals formed at the points where the rods enter the glass envelope. Thus metal to glass seal 18*a* is provided at the end of tube 12 whereat solid rod 18 enters, and metal to glass seal 19*a* is provided at the end of tube 12 whereat solid rod 19 enters. The glass tube is sealed and prior to sealing it is filled with an inert gas such as a nitrogen gas.

Contact arms 20 and 21 are flat reeds formed from a magnetic material to provide arms for electrical contacts 20*a* and 21*a* respectively. In the figures, contact arms 20 and 21 are shown spot welded to tubes 18 and 19. It should be understood that each of the contact arms can be integral with its respective tube and that a single round wire which is flattened at an end to form the contact arm can be used for each. The contacts are, in this embodiment, rhodium plated, but may be of any suitable contact material.

Rods 18 and 19 are also formed from a magnetic material so that with arms 20 and 21 they provide the core of coil 11 which is wound around the external surface of envelope 12.

Coil 11 can be assembled by winding around envelope 12 either directly on the glass or on a bobbin not shown into which the glass tube has been placed. It may be desirable to coat the glass tube with a pliable substance such as neoprene prior to winding the coil about the tube in order to aid in winding and allow for contraction of the coil in low temperature. This substance is not shown in the figures, since it is a method well-known in the art. This pliable substance may also be a resin or potting compound commonly used for this purpose.

Electrical conductors 14 and 17 are rigidly connected to metal rods 18 and 19 respectively so that electrical connections may be made to the contact arms 20 and 21. Also leads 15 and 16 extend from the coil ends so that electrical connections may be made to either end of coil 11. Leads 14, 15, and 17 each are flat metal pieces formed of electrical conducting material with rectangular cross sections and are arranged so that they extend in the same plane radially from the central axis of tube 12. Since these leads lie in the same plane they can extend through slot 10*a* so that electrical connections may be made to the contacts and to the coil from outside casing 10.

In order to insulate coil 11 and leads 14, 15, 16 and 17 from casing 10, insulation paper 13 is provided between coil 11 and casing 10. The insulation paper preferred is of rectangular shape and is shown extending though slot 10*a* in Fig. 2. This paper, in addition to insulating the coil from the case, also insulates the leads 14, 15, 16 and 17 which extend radially from the slot 10*a* in the case from electrical contact with the case. Insulation paper 13 also insulates any printed circuit wiring in the ultimate application or installation from the case. In the ordinary manner in which the printed circuit will be used the radial leads 14, 15, 16 and 17 will be attached to the printed circuit board by any suitable means and the insulation paper 13 will insulate any electrically conductive components on the board from case 10.

If it is desired to avoid using the paper, a potting compound of resin or a vinyl compound which would act as an insulating coating may be used. The coil having been wound on the glass envelope and the leads provided as shown in Fig. 3, the assembly could be dipped into the potting compound prior to insertion into the cylindrical hollow tube 10.

After the insulation has been provided the assembly as shown in Fig. 3 is inserted into the cylindrical hollow tube and leads 14, 15, 16 and 17 extend outwardly through slot 10*a*. The resilient spring action of case 10 maintains the whole assembly together providing a simple assembly having the contact and coil leads brought out radially in the same plane thereby lending itself to automated assembly.

The case acts as a mechanical shield protecting the windings and in addition shields the relay and relay coil from magnetic fields external to itself while shielding external circuits from its own magnetic field.

In addition to these highly desirable results, the shield being composed of magnetic material acts as an external core or external magnetic path directing the flow of flux. The magnetic case 10 provides an external path for the magnetic flux lines which are developed when leads 15 and 16 are energized, thus energizing coil 11. The flux lines external to coil 11 would, were it not for magnetic case 10, pass through air which has high reluctance. Thus the provision of an magnetic external case decreases the reluctance of the magnetic path, since without this case, the magnetic path would consist of the contact arms, leads 18 and 19 and the air surrounding the coil itself. Therefore, the provision of a case formed of magnetic material decreases the reluctance of the path and improves the operating efficiency.

In operation the switch as shown is a normally open switch, and contacts 20*a* and 21*a* are separated from one another. Upon energization of coil 11 by application of an electrical potential to leads 15 and 16, an electromagnetic force is set up tending to bring the contacts 20*a* and 21*a* to gether until contact is made completing a circuit from lead 14 to lead 17. Upon removal of the energizing current from leads 15 and 16, the circuit from lead 14 to lead 17 is opened since the contacts 20*a* and 21*a* will be separated by the resilient action of contact arms 20 and 21 as they seek the normally opened position.

The switch shown can of course be adapted to the normally closed or transfer type when it is so desired by techniques familiar in this art.

Still greater efficiency can be obtained by filling the ends of the relay with a magnetic binder. The magnetic binder can consist of any binder material, which is not electrically conductive, filled with finely divided iron. By filling the ends, the air gap is decreased, and the reluctance of the magnetic circuit is decreased.

Such an arrangement, when a magnetic filler is used, increases the power efficiency of the relay by a factor of nearly three over the switch used without the magnetic shield.

Figure 7:
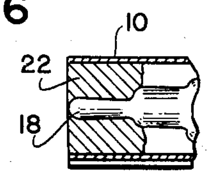
Fig. 7 is a segmental view of an end of the relay constructed in accordance with the teachings of this invention with a magnetic filler as in one embodiment of the invention.
Figure 8:
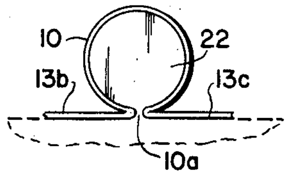
Fig. 8 is an end view of the relay shown in Fig. 7 illustrating the filler used in this embodiment of the invention.

Figs. 7 and 8 are end views of an electromagnetic relay constructed in accordance with the teachings of this invention having potting compound at the ends. Thus in Fig. 7, potting compound 22 is shown at an end of the relay and the remaining parts are designated by the same numerals that were used in the other figures. Case 10 and lead 18 are shown in Fig. 7, and insulation paper 13 is shown extending from slot 10*a*. The pottting compound which is designated by the numeral 22 aids the resilient case 10 in maintaining the assembly intact.

The potting compound can be any material which bonds with the inner surface of case 10, and can be used without magnetic materials when its bounding characteristics alone are desired. If the potting compound is filled with magnetic or iron materials, the magnetic reluctance is further reduced since without the magnetic potting compound, a high reluctance path exists between each of the leads 18 and 19 which act as portions of the core and case 10. In other words, the distance between lead 18 or lead 19 and case 10 would be a portion of the magnetic path of high reluctance since it would represent an air gap. Whereas if the potting compound containing magnetic material is used, the air gap would be reduced further.

However, it is noted that there is a limitation on the amount of magnetic material that can be placed in the potting compound. The amount of particles of iron placed in the compound must be such as not to destroy the insulation between the magnetic case and the leads 18 and 19. The binder material can be a material such as shellac which would preserve the insulation properties of iron reduced from iron carbonal which has been found to be suitable for this purpose.

Figure 9:
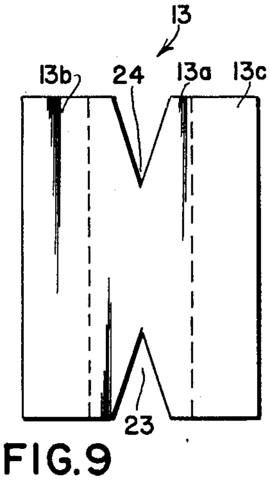
Fig. 9 is a plan view of the insulating paper used in the relay to electrically insulate the coil wire from the casing, and the casing from external circuits.

The insulating paper 13 acts to insulate the coil from the case and also to keep case 10 off the board as well as to insulate leads 14, 15, 16 and 17 from the casing. As seen in Fig. 9, the portion of the insulation paper marked 13*a* is that which would upon completion of the assembly lie around or surround the switch and the coil thereby insulating the coil from the case. And portions 13*b* and 13*c* would act as flaps which extend from slot 10*a* in the case to insulate the casing from a board upon which it might be placed. The V-notch slots 23 and 24 formed in area 13*a* of insulating paper 13 allow the paper to run the full length of casing 10 and also allow the potting compound to come in contact with the inner surface of case 10 to allow a firm bond to the case to be achieved, further increasing the reliability of the assembly under conditions of high acceleration and shock since the spring action of the case will be aided in maintaining the assembly intact. If a potting compound were not used at the ends of the assembly, notches 23 and 24 could be omitted from the insulating paper.

Also the insulating paper itself could be completely omitted if it is desired to use an insulating resin or insulating potting compound as a coating on the assembly which is shown in Fig. 3. The insulating compound would cover the coils, the leads and the glass thereby eliminating the necessity of using the insulating paper.

A further embodiment of the invention would be to dip the assembly as shown in Fig. 3 in an insulating compound and then further dip the whole assembly then into a magnetic plastic so that the casing 10 could be eliminated altogether.

Figure 6:
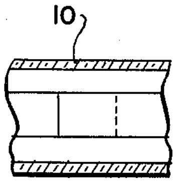
Fig. 6 is a segmental view from above of the contacts shown in Fig. 5 illustrating the two flat contact surfaces approaching each other.
Figure 5:
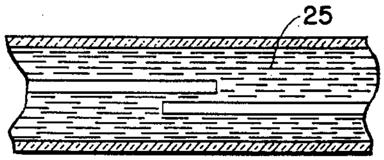
Fig. 5 is a segmental view of the contacts of a relay constructed in accordance with the teachings of this invention surrounded by a viscous material as in one embodiment of the invention.

Figs. 5 and 6 illustrate another embodiment of the invention wherein the nitrogen gas or inert atmosphere within tube 12 is eliminated and a viscous fluid designated in the drawing by the numeral 25 is placed therein. The use of viscous fluid for suppression of vibration of contacts and contact arms is well-known in the switch art. In relays where "bounce" is produced by vibration caused by the mechanical shock of contact closure this technique is well known. In the present invention, however, an innovation results from the fact that the contacts are an integral part of the magnetic armature and are themselves part of the magnetic circuit. This is opposed to the normal relays where there is a relatively loose mechanical couple between armature and contact. The contact surfaces **20*a* and 21*a*** are flat as opposed to the usual spherical or curved wiping surfaces. In this design the contacts do not wipe against one another.

Since the electrical gap in the relay is also the magnetic gap, as the relay closes, the gap decreases and the force closing the contacts increases since the reluctance of the magnetic circuit is decreased. This results in increasing acceleration of the contacts toward one another as the contacts close. When the contacts strike one another a shock is produced which results in a bounce. If, instead of attempting to dampen the vibration with viscous fluid, a force is applied which counteracts the increasing acceleration so that the shock at closure is lessened, the problem is attacked at its source.

As the contacts come together they must push the viscous fluid lying between them out. Thus as the two flat parallel contacts **20*a* and 21*a*** approach each other in the viscous fluid, the closer they get, the more difficult it is for the remaining fluid to escape since there is a lessening of the escape area. This is a new manner of avoiding bounce. The previous applications of viscous damping show the viscous drag was approximately proportional to the speed of motion of the object to be damped. In this conception it is this factor, plus the new factors introduced, which becomes inversely proportional to the distance between the flat contacts. Thus the drag or opposing force increases as the contacts close counteracting the increased pulling force through the same action.

Theoretically, if the contacts were perfectly flat and parallel, they would never touch because of a molecular layer of viscous fluid between the contacts. In application however, no surface is absolutely flat and some protrusion or lack of parallel would ultimately allow contact.

This technique can be used to control closure time by varying the viscosity and using fluids whose viscosity is least affected by temperature. For example, the greater the viscosity, the greater the force required to push the contacts together in a given delay time.

The relay, which is the subject of this invention, can be utilized as an alternating current relay as well as a direct current relay. As the voltage applied at leads 15 and 16 decreases, the force tending to bring the contacts together decreases and goes to zero; and as the voltage increases in the negative direction, the force closing the contacts again increases. When the integrated closing forces developed in time by the current is greater than the opening mechanical forces, the contacts will tend to go together. When the electrically developed closing force is greater than the mechanical opening force during most of the cycle, the application of alternating current will close the switch over several cycles.

The slot in the magnetic path aids the operation since if the slot **10*a* was not provided in the case 10**, the case would act as a single turn secondary. That is the case would provide a shorted turn secondary which would set up a magnetic field of its own during the transient time of opening or closing—this field would act to slow the operation of the magnetic arms, and the fact that the slot is in the direction of the magnetic flux is important since it gives minimum magnetic reluctance. If a spiral slot was provided, the flux path through the metal would be longer.

Thus, among others, the several objects in the invention as specifically aforenoted are achieved. Obviously, numerous changes in construction and re-arrangement of parts might be resorted to without departing from the spirit of the invention as defined by the claims.

I claim:

1. An electromagnetic switch comprising in combination a sealed member of substantially cylindrical configuration, an electrically conductive coil wound on said member, a magnetic armature disposed within said member with an end thereof extending outwardly from said member, a second magnetic armature disposed within said member with an end thereof extending outwardly from said member, said magnetic armatures providing a core of said coil, means for connecting said coil to an energizing source, a magnetic member of substantially cylindrical configuration surrounding said coil to complete the magnetic path thereof, a full length longitudinal slot formed in said magnetic member and insulation means disposed between said coil and said magnetic member to electrically insulate said magnetic member and said coil.

2. An electromagnetic switch comprising in combination a sealed member of substantially cylindrical configuration, an electrically conductive coil wound on said member, a magnetic armature disposed within said member with an end thereof extending outwardly from said member, a second magnetic armature disposed within said member with an end thereof extending outwardly from said member, said magnetic armatures providing a core of said coil, means for connecting said coil to an energizing source, a resilient case of substantially cylindrical configuration surrounding said coil, a full length longitudinal slot formed in said case and insulation means disposed between said coil and said case to electrically insulate said case and said coil.

3. An electromagnetic switch in accordance with claim 2, in which the means for connecting the coil to an energizing source consists of substantially rigid leads attached to the ends of said coil and extending radially in the same plane through the slot in the case.

4. An electromagnetic switch comprising in combination a sealed member of substantially cylindrical configuration, an electrically conductive coil wound on said member, a magnetic armature disposed within said member with an end thereof extending outwardly from said member, a second magnetic armature disposed within said member with an end thereof extending outwardly from said member, said magnetic armatures providing a core of said coil, means for connecting said coil to an energizing source, a resilient metal case of substantially cylindrical configuration surrounding said coil, a full length longitudinal slot form in said case, and insulation means disposed between said coil and said case to electrically insulate said coil and said case, and means for connecting each of said armatures to an electrical circuit.

5. An electromagnetic switch in accordance with claim 4, in which the means for connecting each of the armatures to an electrical circuit comprises radially extending coplanar leads attached to each of said armatures at the point whereat the armatures extend outwardly from the sealed member.

6. An electromagnetic switch in accordance with claim 4, in which the means for connecting the coil to an energizing source and the means for connecting each of the armatures to electrical circuits consists of metal leads extending radially from the sealed member in one plane so that the leads can pass through the longitudinal slot in the case.

7. An electromagnetic switch in accordance with claim 4, in which the insulation means is a single piece of insulation material which surrounds the coil and has each of its ends extending outwardly through the longitudinal slot in the case and adjacent the sides of the longitudinal slot to prevent contact of the leads and the case.

8. An electromagnetic switch in accordance with claim 4, in which the insulation means consists of a single sheet of insulation paper which surrounds the coil and has the ends thereof extending outwardly through the longitudinal slot in the case to such an extent that it is capable of electrically insulating the case from contact with surrounding objects.

9. An electromagnetic switch comprising in combination a sealed member of substantially cylindrical configuration, an electrically conductive coil wound on said member, a magnetic armature disposed within said member with an end thereof extending outwardly from said member, a second magnetic armature disposed within said member with one end thereof extending outwardly from said member, said magnetic armatures providing a core of said coil, means for connecting said coil to an energizing source, a magnetic case of substantially cylindrical configuration surrounding said coil, a potting compound adjacent each end of said sealed member and adjacent a portion of the surface of said case whereby the bond of said potting compound with said case can maintain the sealed member in position, finely divided magnetic materials disposed within said potting compound to complete the magnetic path of the coil and insulation means disposed around said coil to insulate said coil electrically.

10. An electromagnetic switch in accordance with claim 9, in which the insulation means consists of a single piece of insulation paper surrounding the coil and having the ends thereof notched so that the potting compound contacts the inner surface of the case.

References Cited in the file of this patent

UNITED STATES PATENTS

| | | |
|---|---|---|
| 2,264,124 | Schreiner | Nov. 25, 1941 |
| 2,289,830 | Ellwood | July 14, 1942 |
| 2,332,338 | Peek | Oct. 19, 1943 |
| 2,547,003 | Hastings | Apr. 3, 1951 |
| 2,570,315 | Brewer | Oct. 9, 1951 |